(12) United States Patent
Yu

(10) Patent No.: US 6,592,939 B1
(45) Date of Patent: Jul. 15, 2003

(54) SYSTEM FOR AND METHOD OF USING DEVELOPER AS A SOLVENT TO SPREAD PHOTORESIST FASTER AND REDUCE PHOTORESIST CONSUMPTION

(75) Inventor: James Jiahua Yu, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 133 days.

(21) Appl. No.: 09/875,596

(22) Filed: Jun. 6, 2001

(51) Int. Cl.[7] .............................. B05D 3/12; B05D 1/36
(52) U.S. Cl. .................. 427/240; 427/402; 427/407.1; 427/425; 118/52; 118/320; 438/758
(58) Field of Search ................................ 427/240, 425, 427/407.1, 402; 118/52, 320; 438/758

(56) References Cited

U.S. PATENT DOCUMENTS

| | | | | |
|---|---|---|---|---|
| 5,919,520 A | * | 7/1999 | Tateyama et al. | 427/240 |
| 5,942,035 A | * | 8/1999 | Hasebe et al. | 118/52 |
| 5,962,070 A | | 10/1999 | Mitsuhashi et al. | 427/240 |

* cited by examiner

*Primary Examiner*—Shrive P. Beck
*Assistant Examiner*—Kirsten Crockford Jolley
(74) *Attorney, Agent, or Firm*—Foley & Lardner

(57) ABSTRACT

An exemplary method of using developer as a solvent to spread photoresist faster and reduce photoresist consumption can include dispensing a developer solution onto an integrated circuit wafer, spinning the integrated circuit wafer to distribute the developer solution over the integrated circuit wafer, and dispensing a photoresist solution onto the integrated circuit covered with the developer solution.

14 Claims, 1 Drawing Sheet

SYSTEM FOR AND METHOD OF USING DEVELOPER AS A SOLVENT TO SPREAD PHOTORESIST FASTER AND REDUCE PHOTORESIST CONSUMPTION

FIELD OF THE INVENTION

The present specification relates generally to the field of integrated circuits and to methods of manufacturing integrated circuits. More particularly, the present specification relates to the use developer as a solvent to spread photoresist faster and then reduce the photoresist consumption.

BACKGROUND OF THE INVENTION

Generally, conventional integrated circuit manufacturing processes involve the transfer of geometric shapes on a mask to the surface of a semiconductor wafer or layer above the semiconductor wafer. The semiconductor wafer corresponding to the geometric shapes, or corresponding to the areas between the geometric shapes, is etched away. The transfer of the shapes from the mask to the semiconductor wafer typically involves a lithographic process. Conventional lithographic processes include applying a pre-polymer solution to the semiconductor wafer, the pre-polymer being selected to form a radiation-sensitive polymer which reacts when exposed to ultraviolet light, electron beams, x-rays, or ion beams. The solvent in the pre-polymer solution is removed by evaporation, and the resulting polymer film is then baked. The film is exposed to radiation, such as, ultraviolet light, through a photomask supporting the desired geometric patterns.

The images in the photosensitive material are then developed by soaking the wafer in a developing solution. The exposed or unexposed areas are removed in the developing process, depending on the nature of the radiation-sensitive material. Then, the wafer is placed in an etching environment which etches away the areas not protected by the radiation-sensitive material. Due to their resistance to the etching process, the radiation sensitive-materials are also known as photoresists.

The high cost of photoresist pre-polymer solutions makes it desirable to devise methods of improving the efficiency of the coating process to minimize the amount of the polymer solution required to coat a substrate. Furthermore, thickness uniformity of the photoresist layer is an important criterion in the manufacture of integrated circuits. When the radiation is focused through the mask onto the coating, variations in thickness of the coating prevent the precise focus of the radiation over the entire surface of the wafer. Such precision is necessary to ensure satisfactory reproduction of the geometric patterns on the semiconductor wafer. Moreover, high precision is particularly important for advanced circuits with line width dimensions approaching 0.25 micron line widths and smaller.

Photoresist is often deposited to a substrate, or more particularly a wafer, by means of forming a puddle followed by spinning (i.e., spin coating). A large puddle of photoresist covering more than half of the substrate area is applied via a dispenser that directs a steady flow of resist in liquid form. The thickness of the puddle is of the order of a millimeter. The substrate is then spun at a speed ranging from 1,000 to 10,000 RPM to thoroughly spread out and remove the excess resist. This spinning results in a film thickness on the order on between a fraction of micrometer and a few micrometers. Therefore, only a small percentage of the photoresist material actually remains on the substrate. Most of the photoresist material dispensed is wasted, resulting in high cost and waste disposal problems.

During conventional photoresist spin coating, as much as 90% of photoresist material is spun away and wasted. Thus, there is a need to dispense photoresist material in a more efficient manner. Further, there is a need to dispense photoresist material that limits waste and increases uniformity of the dispensed photoresist material.

Thus, there is a need to reduce the expensive photoresist consumption by helping the photoresist material spread faster. Further, there is a need to use developer as a solvent to serve as an aid to reduce inefficient loss of photoresist material during photoresist spin coating. Further still, there is a need to reduce photoresist consumption in the spin coating process.

SUMMARY OF THE INVENTION

An exemplary embodiment of the invention is related to a method of using developer as a solvent to spread photoresist faster and reduce photoresist consumption. This method can include dispensing a developer solution onto an integrated circuit wafer, spinning the integrated circuit wafer to distribute the developer solution over the integrated circuit wafer, and dispensing a photoresist solution onto the integrated circuit covered with the developer solution.

Another exemplary embodiment is related to a resist dispensing system used in the dispensing of photoresist material on an integrated circuit wafer in an integrated circuit fabrication process. This system can include a wafer supporting structure configured to spin an integrated circuit wafer, a nozzle for dispensing a developer solution on the integrated circuit wafer, and a nozzle for dispensing a photoresist material on the integrated circuit wafer.

Another embodiment is related to a method for efficient dispensing of photoresist material onto an integrated circuit substrate. This method can include providing a developer coating onto an integrated circuit substrate, dispensing a photoresist solution onto the integrated circuit substrate having the developer coating, and rotating the integrated circuit substrate to distribute the photoresist solution over the integrated circuit substrate.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
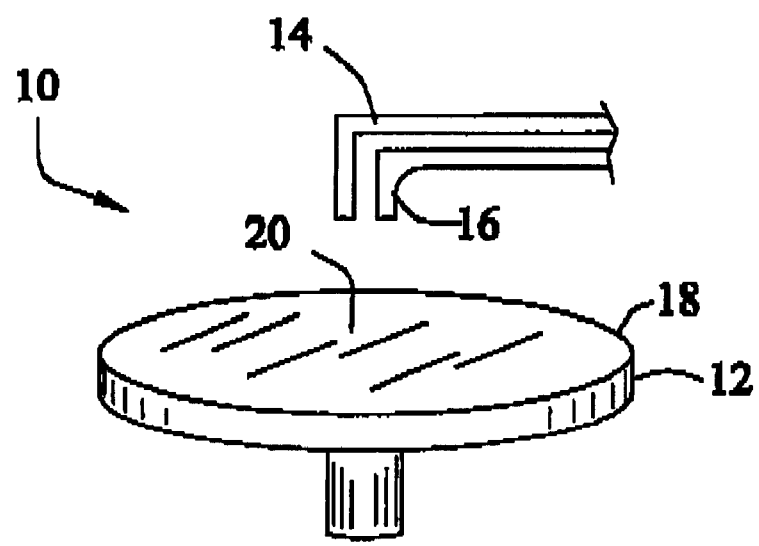
FIG. 1 is a perspective view of a resist dispensing system in accordance with an exemplary embodiment.

Referring to FIG. 1, a resist dispensing system 10 includes a wafer supporting structure 12, a nozzle 14 for dispensing developer solution, and a nozzle 16 for dispensing photoresist material. An integrated circuit (IC) wafer 18 can be disposed on wafer supporting structure 12. As used in this application, the term wafer refers to any substrate used in IC fabrication processes or a layer or layers above such a substrate. The substrate or layer above can be conductive, semiconductive, or insulative.

Nozzle 14 for dispensing developer solution is generally configured to dispense a developer solution to integrated circuit wafer 14. In an exemplary embodiment, the developer solution is used as a solvent to serve as an aid to reduce inefficient lose of photoresist material during photoresist spin coating. In an exemplary embodiment, developer solution forms a developer solution coating 20 on integrated circuit wafer 18. Developer solution coating 20 can have a thickness of 1 µm.

Nozzle 16 for dispensing photoresist material is configured to dispense photoresist material after the developer solution is dispensed from nozzle 14. Photoresist material can any suitable material for creating a coating of photoresist or any such anti-reflective coating. In an exemplary embodiment, nozzle 14 and nozzle 16 are separate nozzles coupled to separate channels or pipes carrying separate solution or material. In an alternative embodiment, nozzle 14 and nozzle 16 are integrated into one unitary nozzle coupled to a single channel or pipe which carries different solutions or materials at different times. The size and shape of nozzles 14 and 16 are not shown in a limiting fashion.

In an exemplary embodiment, integrated circuit wafer 18 is 200 mm or 8 inches in diameter. The amount of developer solution dispensed depends on the size of the integrated circuit wafer 18. For example, if integrated circuit wafer 18 is a 6 inch wafer, nozzle 14 dispenses developer solution at a rate of 0.03 ml/sec and a quantity of 5 µm dispensed thickness. Generally, nozzle 14 dispenses an amount of developer solution to provide a coating of developer solution (developer solution coating 20) with a thickness of between 1.0 µm and 5.0 µm on integrated circuit wafer 18.

In an exemplary embodiment, nozzle 16 dispenses photoresist material onto integrated circuit wafer 18 having a coating of developer solution. Like the amount of developer solution dispensed, the amount of photoresist material dispensed depends on the size of the integrated circuit wafer 18. For example, integrated circuit wafer 18 is a 200 mm wafer, nozzle 16 dispenses photoresist material at a rate of 0.017 ml/sec and a quantity of 4 cubic centimeters (cc). With the coating of developer solution, only 2 cc of photoresist material are needed.

Advantageously, developer solution coating 20 reduces the consumption of photoresist material dispensed from nozzle 16 for dispensing photoresist material. In an exemplary embodiment, developer solution coating 20 reduces photoresist consumption from 4 cubic centimeters per wafer where no developer solution is used to 2 cubic centimeters per wafer where developer solution coating 20 is used. The developer solution coating 20 allows photoresist material to spread with less resistance.

During conventional photoresist spin coating processes, a large percentage of photoresist is wasted. Conventional spin coating processes dispense photoresist material from a nozzle which deposits a puddle of photoresist material onto a wafer. The puddle of photoresist material is distributed by spinning the integrated circuit wafer. Much of the photoresist material from the puddle is spun off the integrated circuit wafer. Furthermore, the resist thickness uniformity is hard to control using conventional systems. Thickness uniformity is particularly hard to control on topographic patterns with conventional photoresist coating processes. Advantageously, developer solution coating 20 greatly reduces photoresist consumption and improves overall photoresist thickness uniformity.

Figure 2:
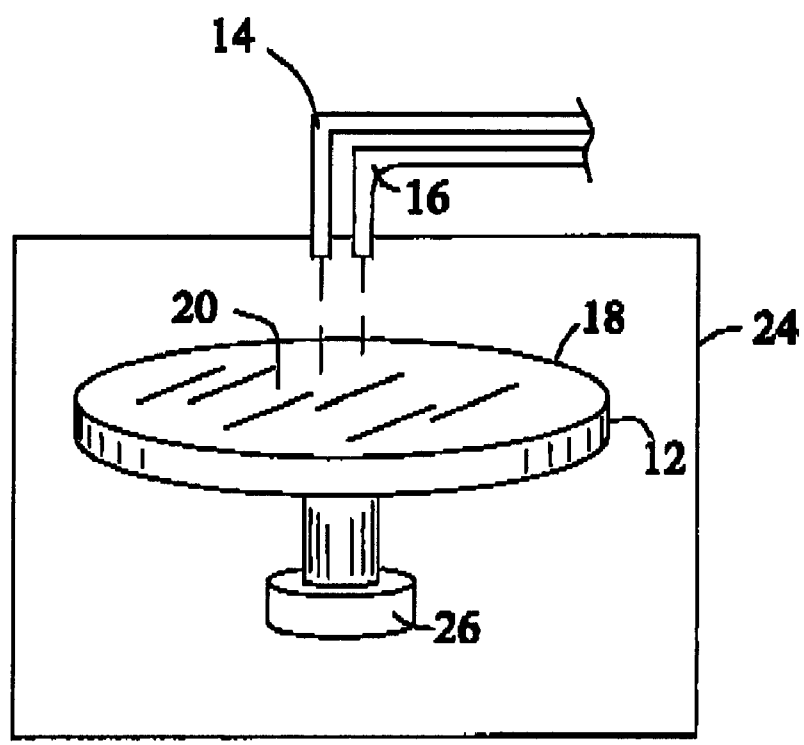
FIG. 2 is a representation of a thin chamber configured to dispense developer solution and photoresist on a wafer in accordance with an exemplary embodiment.

Referring now to FIG. 2, photoresist material and developer solution are introduced into a spin chamber 24. In an exemplary embodiment, wafer supporting structure 12 is coupled to a rotatable member 26. During the dispensing of the photoresist material, integrated circuit wafer 18 can be rotated to aid in the coating of integrated circuit wafer 18. Likewise, during the dispensing of developer solution from nozzle 14, the wafer supporting structure 12 can also be rotated to aid in the coating process.

The size of nozzles 14 and 16 is chosen to be significantly small such that the surface tension of the liquid resist prevents it from dripping. Yet, nozzles 14 and 16 are chosen to be sufficiently large to facilitate nozzles 14 and 16 fabrication and to prevent too much surface tension which hinders this dispensing. The usable range of size of nozzle 14 and nozzle 16 is between 0.1 mm and 20 mm. Whereas, the preferred range is between 0.2 mm and 0.5 mm. Nozzles 14 and 16 are located close in proximity to each other. In alternative embodiments, nozzles 14 and 16 are contained in one unitary nozzle.

In exemplary embodiments, slow spin speed ranges of wafer supporting structure 12 can range from 0.1 to 100 rpm. High-speed spin ranges from 500 to 20,000 rpm. A preferred time for dispensing developer solution from nozzle 14 is between 1 and 10 seconds. A preferred time for dispensing photoresist material from nozzle 16 is between 1 and 10 seconds. Using a dispense time of 3 seconds while wafer supporting structure 12 rotates at 20 rpm, the resist flow rate is 0.017 ml/seconds. In alternative embodiments, where the integrated circuit wafer does not rotate, the resist flow rate can be 0.05 to 0.01 ml/seconds.

While the embodiments illustrated in the FIGURES and described above are presently preferred, it should be understood that these embodiments are offered by way of example only. Other embodiments may include, for example, different methods of dispensing or depositing various developer solutions as well as different methods of depositing photoresist material onto integrated circuit wafer 18. The invention is not limited to a particular embodiment, but extends to various modifications, combinations, and permutations that nevertheless fall within the scope and spirit of the appended claims.

What is claimed is:

1. A method of using developer as a solvent to spread photoresist faster and reduce photoresist consumption, the method comprising:

dispensing a developer solution onto an integrated circuit wafer;

spinning the integrated circuit wafer to distribute the developer solution over the integrated circuit wafer; and dispensing a photoresist solution onto the integrated circuit wafer covered with the developer solution.

2. The method of claim 1, further comprising spinning the integrated circuit wafer to distribute the photoresist solution over the integrated circuit wafer.

3. The method of claim 1, wherein the developer solution is coated over the integrated circuit wafer at a thickness of between 1 µm and 5 µm.

4. The method of claim 1, wherein the step of dispensing a photoresist solution comprises dispensing 2 cubic cm of photoresist solution to cover the integrated circuit wafer.

5. The method of claim 1, wherein the step of dispensing a developer solution comprises spraying developer solution from a nozzle.

6. The method of claim 5, wherein the step of dispensing a photoresist solution comprises spraying photoresist solution from a different nozzle than the nozzle used to spray developer solution.

7. The method of claim 5, wherein the step of dispensing a photoresist solution comprises spraying photoresist solution from the same nozzle as the nozzle used to spray developer solution.

8. A method for efficient dispensing of photoresist material onto an integrated circuit substrate, the method comprising:

providing a developer coating onto an integrated circuit substrate;

dispensing a photoresist solution onto the integrated circuit substrate having the developer coating; and rotating the integrated circuit substrate to distribute the photoresist solution over the integrated circuit substrate.

9. The method of claim 8, wherein the step of providing a developer coating comprises spraying a developer solution from a nozzle to the integrated circuit substrate.

10. The method of claim 8, wherein the step of providing a developer coating comprises pouring a developer solution from a pipe onto the integrated circuit substrate and spinning the integrated circuit substrate to distribute the developer solution over the integrated circuit substrate.

11. The method of claim 8, wherein the developer coating has a thickness of between 1 $\mu$m and 5 $\mu$m.

12. The method of claim 8, wherein the amount of photoresist solution dispensed is 2 cubic centimeters (cc) per substrate.

13. The method of claim 8, wherein the step of rotating the integrated circuit substrate is performed while developer solution is provided and while the photoresist solution is dispensed.

14. The method of claim 8, wherein developer solution for the developer coating and the photoresist solution come from two different nozzles.

* * * * *